US011935987B2

(12) United States Patent
Lopez et al.

(10) Patent No.: US 11,935,987 B2
(45) Date of Patent: Mar. 19, 2024

(54) LIGHT EMITTING DIODE ARRAYS WITH A LIGHT-EMITTING PIXEL AREA

(71) Applicant: Lumileds LLC, San Jose, CA (US)

(72) Inventors: Toni Lopez, Vaals (NL); Erik William Young, San Jose, CA (US); Rajiv Pathak, Milpitas, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/973,070

(22) Filed: Oct. 25, 2022

(65) Prior Publication Data

US 2023/0133315 A1 May 4, 2023

Related U.S. Application Data

(60) Provisional application No. 63/275,160, filed on Nov. 3, 2021.

(51) Int. Cl.
 *H01L 33/38* (2010.01)
 *H01L 27/15* (2006.01)
 (Continued)

(52) U.S. Cl.
 CPC .......... *H01L 33/382* (2013.01); *H01L 27/156* (2013.01); *H01L 33/0093* (2020.05);
 (Continued)

(58) Field of Classification Search
 CPC . H01L 33/382; H01L 27/156; H01L 33/0093; H01L 33/62; H01L 2933/0016;
 (Continued)

(56) References Cited

U.S. PATENT DOCUMENTS 6,410,942 B1 6/2002 Thibeault et al.
6,657,236 B1 12/2003 Thibeault et al.
(Continued)

FOREIGN PATENT DOCUMENTS

DE 102010051286 A1 5/2012
DE 102012109460 A1 4/2014
(Continued)

OTHER PUBLICATIONS

PCT International Search Report and Written Opinion in PCT/US2022/047849 dated Feb. 27, 2023, 10 pages.

*Primary Examiner* — Ratisha Mehta
(74) *Attorney, Agent, or Firm* — Servilla Whitney LLC

(57) ABSTRACT

A light emitting diode (LED) array comprises non-segmented pixels in a light-emitting pixel area providing optical efficiency and minimizing dark-grid appearance. The LED array comprises: a monolithic body, a light-emitting pixel area, a plurality of anodes, a common cathode, and one or more dielectric materials. The light-emitting pixel area is integral to the monolithic body. The light-emitting pixel area includes semiconductor layers comprising: a second portion of an N-type layer, an active region, and a P-type layer. The monolithic body comprises a first portion of an N-type layer, and the second portion of the N-type layer is integral to the first portion of the N-type layer. Each anode comprises a P-contact layer and one or more P-contact materials, each P-contact layer is in contact with the P-type layer. The common cathode comprises one or more N-contact materials in contact with the first portion of the N-type layer.

12 Claims, 5 Drawing Sheets

(51) Int. Cl.
*H01L 33/00* (2010.01)
*H01L 33/62* (2010.01)

(52) U.S. Cl.
CPC ...... *H01L 33/62* (2013.01); *H01L 2933/0016* (2013.01); *H01L 2933/0066* (2013.01)

(58) Field of Classification Search
CPC . H01L 2933/0066; H01L 33/14; H01L 33/38; H01L 33/405
See application file for complete search history.

(56) References Cited

U.S. PATENT DOCUMENTS

| | | | |
|---|---|---|---|
| 6,821,804 | B2 | 11/2004 | Thibeault et al. |
| 8,222,811 | B2 | 7/2012 | Vaufrey et al. |
| 8,258,044 | B2 | 9/2012 | Brun et al. |
| 8,487,340 | B2 | 7/2013 | Gilet et al. |
| 8,638,032 | B2 | 1/2014 | Maindron et al. |
| 8,647,957 | B2 | 2/2014 | Borowik et al. |
| 8,697,548 | B2 | 4/2014 | Borowik et al. |
| 8,698,396 | B2 | 4/2014 | Maindron et al. |
| 8,890,111 | B2 | 11/2014 | Templier et al. |
| 9,093,607 | B2 | 7/2015 | Gilet et al. |
| 9,109,296 | B2 | 8/2015 | Metaye et al. |
| 9,112,112 | B2 | 8/2015 | Do et al. |
| 9,192,290 | B2 | 11/2015 | Spinnler et al. |
| 9,209,366 | B2 | 12/2015 | Maindron et al. |
| 9,263,633 | B2 | 2/2016 | Gilet et al. |
| 9,396,970 | B2 | 7/2016 | Gillot et al. |
| 9,422,628 | B2 | 8/2016 | Simonato et al. |
| 9,496,465 | B2 | 11/2016 | Sugimoto et al. |
| 9,507,204 | B2 | 11/2016 | Pelka et al. |
| 9,601,542 | B2 | 3/2017 | Robin et al. |
| 9,722,160 | B2 | 8/2017 | Nakabayashi |
| 9,768,350 | B2 | 9/2017 | Bavencove et al. |
| 9,887,184 | B2 | 2/2018 | Takeya et al. |
| 9,945,526 | A1 | 4/2018 | Singer et al. |
| 9,978,727 | B2 | 5/2018 | Takeya et al. |
| 9,997,688 | B2 | 6/2018 | Takeya et al. |
| 10,002,928 | B1 | 6/2018 | Raring et al. |
| 10,018,325 | B2 | 7/2018 | Kim et al. |
| 10,050,026 | B2 | 8/2018 | Takeya et al. |
| 10,068,884 | B2 | 9/2018 | Takeya et al. |
| 10,145,518 | B2 | 12/2018 | Do et al. |
| 10,964,845 | B2 | 3/2021 | Dimitropoulos et al. |
| 2007/0114541 | A1 | 5/2007 | Edmond et al. |
| 2009/0283787 | A1* | 11/2009 | Donofrio ............ H01L 33/405 257/E33.068 |
| 2011/0151607 | A1 | 6/2011 | Landis et al. |
| 2011/0287606 | A1 | 11/2011 | Brun et al. |
| 2012/0205614 | A1 | 8/2012 | Templier et al. |
| 2013/0020115 | A1 | 1/2013 | Mataye et al. |
| 2013/0112945 | A1 | 5/2013 | Gilet et al. |
| 2013/0214303 | A1 | 8/2013 | Kinoshita et al. |
| 2014/0077156 | A1 | 3/2014 | Bavencove et al. |
| 2014/0094878 | A1 | 4/2014 | Gossler et al. |
| 2014/0138719 | A1 | 5/2014 | Maindron et al. |
| 2015/0118544 | A1 | 4/2015 | Oukassi |
| 2015/0144590 | A1 | 5/2015 | Simonato et al. |
| 2015/0228873 | A1 | 8/2015 | Gebuhr et al. |
| 2015/0280060 | A1 | 10/2015 | Gilet et al. |
| 2015/0380461 | A1 | 12/2015 | Robin et al. |
| 2016/0079565 | A1 | 3/2016 | Maindron et al. |
| 2016/0190400 | A1 | 6/2016 | Jung et al. |
| 2016/0218240 | A1 | 7/2016 | Bouvier et al. |
| 2016/0293811 | A1 | 10/2016 | Hussell et al. |
| 2017/0080457 | A1 | 3/2017 | Eymery et al. |
| 2017/0098746 | A1 | 4/2017 | Bergmann et al. |
| 2017/0137645 | A1 | 5/2017 | Manceau et al. |
| 2017/0186612 | A1 | 6/2017 | Almadori et al. |
| 2017/0236807 | A1* | 8/2017 | Hwang ............ H01L 33/0075 257/90 |
| 2017/0243860 | A1 | 8/2017 | Hong et al. |
| 2017/0293065 | A1 | 10/2017 | Kim |
| 2017/0358563 | A1 | 12/2017 | Cho et al. |
| 2017/0358724 | A1 | 12/2017 | Shichijo et al. |
| 2018/0017939 | A1 | 1/2018 | Allier et al. |
| 2018/0019369 | A1 | 1/2018 | Cho et al. |
| 2018/0019373 | A1 | 1/2018 | Lehnhardt et al. |
| 2018/0061316 | A1 | 3/2018 | Shin et al. |
| 2018/0074372 | A1 | 3/2018 | Takeya et al. |
| 2018/0090540 | A1 | 3/2018 | Von Malm et al. |
| 2018/0138157 | A1 | 5/2018 | Im et al. |
| 2018/0145059 | A1 | 5/2018 | Welch et al. |
| 2018/0149328 | A1 | 5/2018 | Cho et al. |
| 2018/0156406 | A1 | 6/2018 | Feil et al. |
| 2018/0166470 | A1 | 6/2018 | Chae |
| 2018/0174519 | A1 | 6/2018 | Kim et al. |
| 2018/0174931 | A1 | 6/2018 | Henley |
| 2018/0210282 | A1 | 7/2018 | Song et al. |
| 2018/0238511 | A1 | 8/2018 | Hartmann et al. |
| 2018/0259137 | A1 | 9/2018 | Lee et al. |
| 2018/0259570 | A1 | 9/2018 | Henley |
| 2018/0272605 | A1 | 9/2018 | Gmeinsieser et al. |
| 2018/0283642 | A1 | 10/2018 | Liao et al. |
| 2018/0297510 | A1 | 10/2018 | Fiederling et al. |
| 2018/0339643 | A1 | 11/2018 | Kim |
| 2018/0339644 | A1 | 11/2018 | Kim |
| 2018/0354406 | A1 | 12/2018 | Park |
| 2020/0134284 | A1 | 4/2020 | Ling et al. |
| 2020/0243492 | A1 | 7/2020 | Negley et al. |
| 2020/0411487 | A1 | 12/2020 | Andrews |
| 2021/0057611 | A1* | 2/2021 | Guo ................. H01L 33/62 |

FOREIGN PATENT DOCUMENTS

| | | |
|---|---|---|
| DE | 102014112551 A1 | 3/2016 |
| EP | 1378949 A1 | 1/2004 |
| EP | 2027608 A1 | 2/2009 |
| EP | 2203939 A1 | 7/2010 |
| EP | 2211387 A2 | 7/2010 |
| EP | 2339658 A2 | 6/2011 |
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 2006921 B1 | 12/2018 |
| EP | 3410002 A1 | 12/2018 |
| EP | 3410003 A1 | 12/2018 |
| EP | 2710634 B1 | 10/2020 |
| FR | 2952366 A1 | 5/2011 |
| FR | 2964796 A1 | 3/2012 |
| FR | 2969995 A1 | 7/2012 |
| FR | 2972815 A1 | 9/2012 |
| FR | 2974940 A1 | 11/2012 |
| FR | 2974941 A1 | 11/2012 |
| FR | 2975532 A1 | 11/2012 |
| FR | 2991342 A1 | 12/2013 |
| FR | 2991999 A1 | 12/2013 |
| FR | 2998090 A1 | 5/2014 |
| FR | 3011383 A1 | 4/2015 |
| FR | 3041274 A1 | 3/2017 |
| FR | 3046155 A1 | 6/2017 |
| FR | 3052915 A1 | 12/2017 |
| JP | 2016066765 A | 4/2016 |
| KR | 20140118466 A | 10/2014 |
| KR | 20170018687 A | 2/2017 |
| KR | 20180010670 A | 1/2018 |
| KR | 20180114413 A | 10/2018 |
| TW | 201417339 A | 5/2014 |
| TW | 201620163 A | 6/2016 |
| WO | 2006138465 A2 | 12/2006 |
| WO | 2011045289 A1 | 4/2011 |
| WO | 2011048318 A1 | 4/2011 |
| WO | 2012035243 A1 | 3/2012 |
| WO | 2012156620 A2 | 11/2012 |
| WO | 2013182969 A1 | 12/2013 |
| WO | 2015044620 A1 | 4/2015 |

(56) References Cited

FOREIGN PATENT DOCUMENTS

| | | |
|---|---|---|
| WO | 2016079505 A1 | 5/2016 |
| WO | 2017068029 A1 | 4/2017 |
| WO | 2017102708 A1 | 6/2017 |
| WO | 2017184686 A1 | 10/2017 |
| WO | 2017216445 A1 | 12/2017 |
| WO | 2018091657 A1 | 5/2018 |
| WO | 2018139866 A1 | 8/2018 |
| WO | 2018143682 A1 | 8/2018 |
| WO | 2018159977 A1 | 9/2018 |
| WO | 2018169243 A1 | 9/2018 |
| WO | 2019092357 A1 | 5/2019 |
| WO | 2019126539 A1 | 6/2019 |

\* cited by examiner

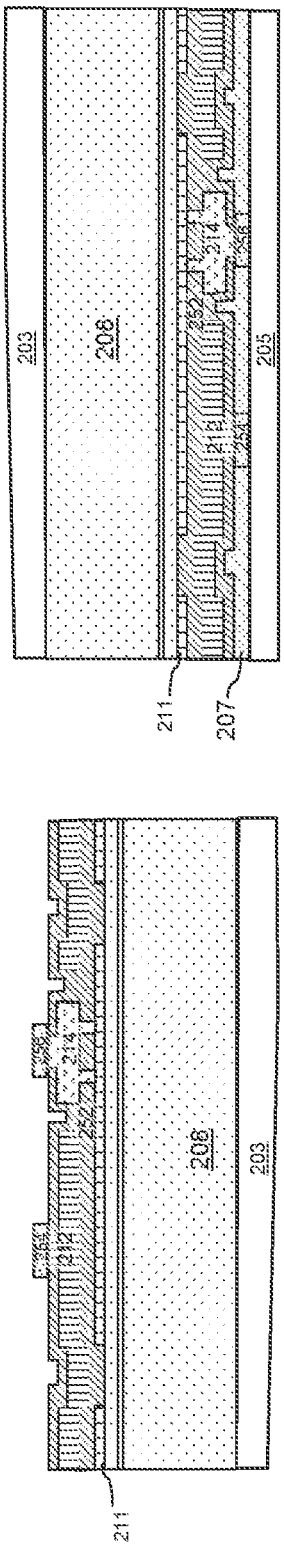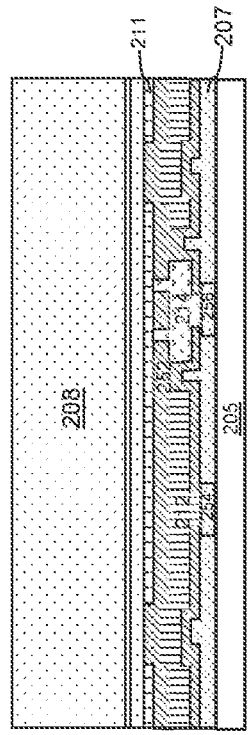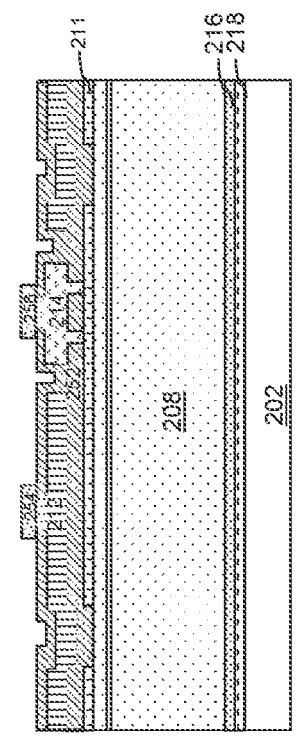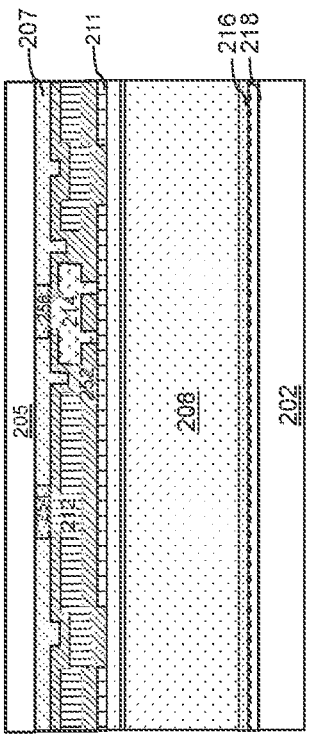

LIGHT EMITTING DIODE ARRAYS WITH A LIGHT-EMITTING PIXEL AREA

CROSS-REFERENCE TO RELATED APPLICATION

This application claims priority to U.S. Provisional Application No. 63/275,160, filed Nov. 3, 2021, the entire disclosure of which is hereby incorporated by reference herein.

TECHNICAL FIELD

Embodiments of the disclosure generally relate to light emitting diode (LED) arrays and methods of manufacturing the same. More particularly, embodiments are directed to arrays comprising: non-segmented pixels in a light-emitting pixel area integral to a monolithic body, a plurality of anodes in contact with a P-type layer, and a common cathode.

BACKGROUND

A light emitting diode (LED) is a semiconductor light source that emits light when current flows through it. LEDs combine a p-type semiconductor with an n-type semiconductor. LEDs commonly use a III-V group compound semiconductor. A III-V group compound semiconductor provides stable operation at a higher temperature than devices that use other semiconductors. The III-V group compound is typically formed on a substrate formed of sapphire aluminum oxide ($Al_2O_3$), silicon (Si), or silicon carbide (SiC). For example, one or more III-nitride materials, such as GaN, can be epitaxially-grown on a substrate or wafer to prepare semiconductor layers.

In-organic light emitting diodes (i-LEDs) have been widely used to create different types of displays, LED matrices and light engines including automotive adaptive headlights, augmented-, virtual-, mix-reality (AR/VR/MR) headsets, smart glasses and displays for mobile phones, smart watches, monitors and TVs. The individual LED pixels in these architectures could have an area of few square millimeters down to few square micrometers depending on the matrix or display size and its pixel per inch requirements. One common approach is to create a monolithic array of LED pixels on an epitaxial (EPI) wafer and later transfer and possibly hybridize these LED arrays to a backplane to control individual pixels.

One embodiment of such monolithic arrays utilizes metal (e.g., Al-based) side-contacts. These side contacts serve as an electrical cathode for each pixel and also provide reflective sidewalls in between the pixels to reduce light scattering and propagation in lateral directions. With this geometry, a metal grid is created in between pixels of an LED display or matrix. Such side contacts typically extend deep into a bottom of a trench in between the pixels formed by etching and/or segmenting the semiconductor (epitaxial) layers, and reach a surface of the substrate. Deep side contacts can be used to ensure low sheet and contact resistance for cathode contacts, and to optically separate each LED pixel so that there is not optical crosstalk, thereby maximize optical contrast. There is, however, a cost of optical absorption due to the limited reflectivity of the metal contact.

In some of these architectures, the substrate (e.g., sapphire, silicon) is removed after the LED array is attached to a backplane controller to enhance light extraction and beam profiling. A standard approach to remove a sapphire substrate is by a laser lift-off process where a laser beam is used to detach the substrate from the epitaxial layers (in this case, LED arrays grown on the substrate). Such methods could damage the side contacts, possibly decreasing light output, yielding unstable full voltage (Vf), or developing electrical leakage. Such effects could also pose long-term reliability concerns.

Designs that limit etching and/or segmenting the semiconductor (epitaxial) layers such that the trench stops before coming into contact with the surface of the substrate would keep the metal contact layer from contacting the substrate and out of the path of the laser lift-off laser beam. A remaining EPI layer at the bottom of such trench is prone to crack during subsequent processing steps or during field operation, which may extend into a pixel mesa and active region, resulting in performance degradation or pixel failure. Such cracks could also delaminate metal sidewall contacts or insulator layers and therefore create a leakage path or other reliability concerns.

Some display applications do not necessitate maximized optical contrast. There is an ongoing need to provide improved reliability, mechanical stability, and handling of arrays and sets of LEDs while maximizing optical efficiency and minimizing dark-grid appearance.

SUMMARY

Provided herein are a light emitting diode (LED) arrays, and methods of making and using them.

In an aspect, a light emitting diode (LED) array comprises: a monolithic body, a light-emitting pixel area, a plurality of anodes, a common cathode, and one or more dielectric materials. The light-emitting pixel area is integral to the monolithic body. The light-emitting pixel area includes semiconductor layers comprising: a second portion of an N-type layer, an active region, and a P-type layer. The monolithic body comprises a first portion of an N-type layer, and the second portion of the N-type layer is integral to the first portion of the N-type layer. Each anode comprises a P-contact layer and one or more P-contact materials, each P-contact layer is in contact with the P-type layer. The common cathode comprises one or more N-contact materials in contact with the first portion of the N-type layer. One or more dielectric materials insulate: the second portion of the N-type layer, the active region, and the P-type layer from the common cathode; the plurality of anodes from each other; and the plurality of anodes from the common cathode.

An additional aspect is a display comprising: a plurality of light emitting diode (LED) arrays according to any embodiments disclosed herein affixed to a device substrate, wherein a first plurality of arrays comprises a red color, a second plurality of arrays comprises a blue color, and a third plurality of arrays comprises a green color.

Another aspect is a method of manufacturing a light emitting diode (LED) array, the method comprises: preparing semiconductor layers including an N-type layer, an active region, and a P-type layer on a growth substrate. A plurality of anodes is constructed in contact with the P-type layer, each anode comprising a P-contact layer and one or more P-contact materials, each P-contact layer being in contact with the P-type layer. A first portion of the N-type layer is exposed, thereby creating a light-emitting pixel area comprising: a second portion of the N-type layer, the active region, and the P-type layer, the second portion of the N-type layer being integral to the first portion of the N-type layer. A common cathode is constructed in contact with on the first portion of the N-type layer. One or more dielectric materials are deposited, insulating: the second portion of the N-type layer, the active region, and the P-type layer from the common cathode, the anodes from each other, and the plurality of anodes from the common cathode.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements. The figures herein are not to scale.

FIGS. 7A-7E show a schematic depiction to apply an array to a device substrate in accordance with one or more embodiments;

DETAILED DESCRIPTION

Figure 1:
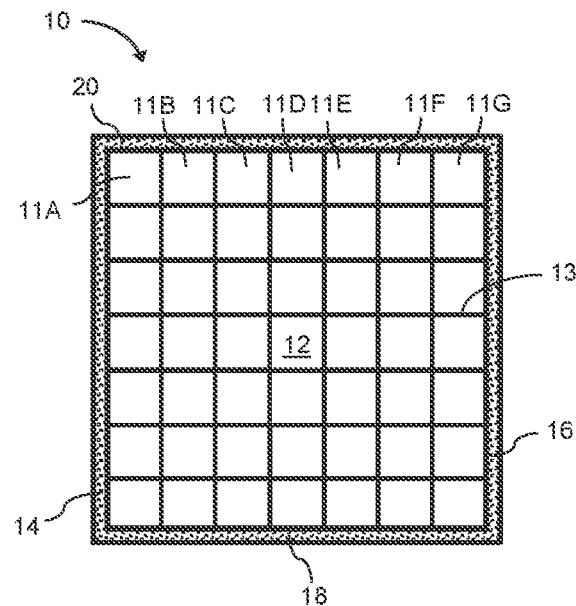
FIGS. 1-2 show illustrations of top views of exemplary a light emitting diode LED array in accordance with some embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate, or on a substrate with one or more films or features or materials deposited or formed thereon.

In one or more embodiments, the "substrate" means any substrate or material surface formed on a substrate upon which film processing is performed during a fabrication process. A "growth substrate" is a substrate on which epitaxial layers are prepared or grown. A "device substrate" is a substrate included in a product. In some embodiments, a growth substrate is removed and no additional substrate is included. In some embodiments, a growth substrate is removed and a device substrate is affixed. In some embodiments, a "temporary substrate" is used during a double flip process including removing the growth substrate and affixing a device substrate. In some embodiments, a growth substrate remains in place and serves as the device substrate. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AN, InN and alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed are also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Reference to LED refers to a light emitting diode that emits light when current flows through it. In one or more embodiments, the LEDs herein have one or more characteristic dimensions (e.g., height, width, depth, thickness, etc. dimensions) in a range of greater than or equal to 75 micrometers to less than or equal to 300 micrometers. In one or embodiments, one or more dimensions of height, width, depth, thickness have values in a range of 100 to 300 micrometers. Reference herein to micrometers allows for variation of ±1-5%. In a preferred embodiment, one or more dimensions of height, width, depth, thickness have values of 200 micrometers±1-5%. In some instances, the LEDs are referred to as micro-LEDs (uLEDs or uLEDs), referring to a light emitting diode having one or more characteristic dimensions (e.g., height, width, depth, thickness, etc. dimensions) on the order of micrometers or tens of micrometers. In one or embodiments, one or more dimensions of height, width, depth, thickness have values in a range of 1 to less than 75 micrometers, for example from 1 to 50 micrometers, or from 1 to 25 micrometers. Overall, in one or more embodiments, the LEDs herein may have a characteristic dimension ranging from 1 micrometers to 300 micrometers, and all values and subranges therebetween.

Methods of depositing materials, layers, and thin films include but are not limited to: sputter deposition, atomic layer deposition (ALD), chemical vapor deposition (CVD), physical vapor deposition (PVD), plasma enhanced atomic layer deposition (PEALD), plasma enhanced chemical vapor deposition (PECVD), and combinations thereof.

Methods of forming or growing semiconductor layers including N-type layer, active region, and P-type layer are formed according to methods known in the art. In one or more embodiments, the semiconductor layers are formed by epitaxial (EPI) growth. The semiconductor layers according to one or more embodiments comprise epitaxial layers, III-nitride layers, or epitaxial III-nitride layers. In one or more embodiments, the semiconductor layers comprise a III-nitride material, and in specific embodiments epitaxial III-nitride material. In some embodiments, the III-nitride material comprises one or more of gallium (Ga), aluminum (Al), and indium (In). Thus, in some embodiments, the semiconductor layers comprises one or more of gallium nitride (GaN), aluminum nitride (AlN), indium nitride (InN), aluminum gallium nitride (AlGaN), indium gallium nitride (InGaN), indium aluminum nitride (InAlN), aluminum indium gallium nitride (AlInGaN) and the like. The III-nitride materials may be doped with one or more of silicon (Si), oxygen (O), boron (B), phosphorus (P), germanium (Ge), manganese (Mn), or magnesium (Mg) depending upon whether p-type or n-type III-nitride material is needed. In one or more embodiments, the semiconductor layers have a combined thickness in a range of from about 2 μm to about 10 μm, and all values and subranges therebetween.

Devices and methods herein advantageously offer LED arrays with individually electrically addressable light-emitting pixels without segmentation of epitaxial layers. Such arrays are useful where strict optical isolation is not necessary. LED arrays according to one or more embodiments comprise non-segmented pixels in a light-emitting pixel area integral to a monolithic body, a plurality of anodes in contact with a P-type layer, and a common cathode. These LED arrays is offer the following advantages: maximized optical efficiency, no dark-grid, e.g., improved optical appearance without pixilation effects; and improved mechanical stability as compared to full or partial metal-filled trenches between pixels. In one or more embodiments, the LED arrays herein are further advantageous over partial metal-filled trenches between pixels with respect to efficiency, optical performance, and electrical injection.

The devices methods herein are suitable to be used with devices and techniques involving monolithic arrays of LEDs. In one or more embodiments, the devices and techniques are suitable for use with projectors. In one or more embodiments, the designs include a composite mirror composed of: a reflective layer (e.g., a metal mirror), via openings defined by via oxide material (e.g., dielectric material), a segmented p-contact layer (e.g., a transparent conductive layer such as ITO); and an edge n-contact (e.g., common cathode).

Figure 2:
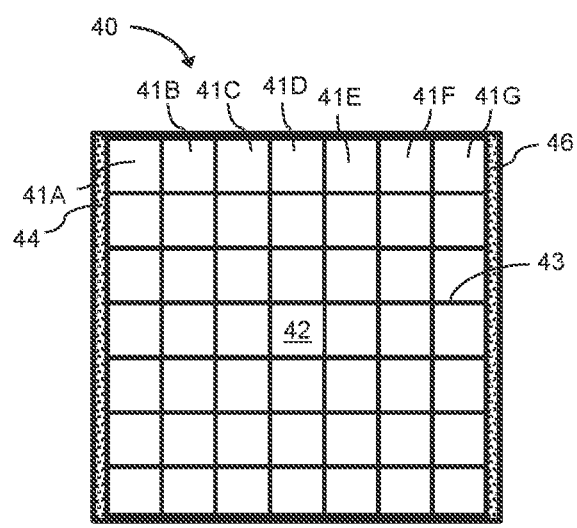

FIGS. 1-2 show illustrations of top views of exemplary a light emitting diode LED array in accordance with some embodiments. For illustration purposes, 7×7 arrays of pixels are shown, but it is understood that arrays may be any size and configuration.

In FIG. 1, array 10 is shown with a light-emitting pixel area 12 and a common cathode of four edge cathodes: a first edge cathode 14, a second edge cathode 16, a third edge cathode 18, and a fourth edge cathode 20. The light-emitting pixel area 12 comprises a plurality of pixels 11; for this embodiment, there are 49 pixels 11, and exemplary pixels 11A to 11G are labeled in one of the rows. In this embodiment, exemplary pixels 11A to 11G are positioned next to the fourth edge cathode 20. Exemplary pixels 41A and 41G are also positioned next to the first edge cathode 14 and the second edge cathode 16, respectively.

Array grid 13 is apparent in use, once the array is energized. According to one or more embodiments, the appearance of the array grid 13 is minimized due to the non-segmented pixels, e.g. pixels 11, of the light-emitting pixel area 12.

In FIG. 2, array 40 is shown with a light-emitting pixel area 42 and a common cathode of two edge cathodes: a first edge cathode 44 and a second edge cathode 46. The light-emitting pixel area 42 comprises a plurality of pixels 41; for this embodiment, there are 49 pixels 41, and exemplary pixels 41A to 41G are labeled in one of the rows. In this embodiment, exemplary pixels 41A and 41G are positioned next to the first edge cathode 44 and the second edge cathode 46, respectively.

Array grid 43 is apparent in use, once the array is energized. According to one or more embodiments, the appearance of the array grid 13 is minimized due to the non-segmented pixels, e.g. pixels 41, of the light-emitting pixel area 42.

Figure 3:
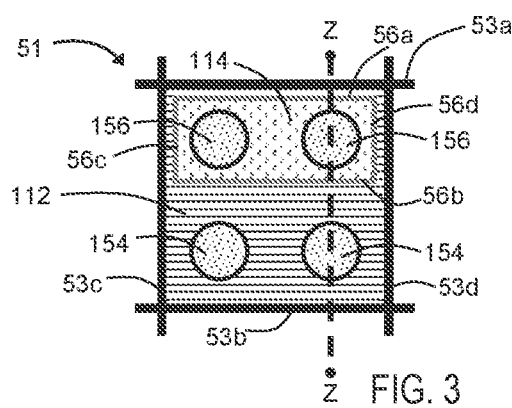
FIG. 3 shows an illustration of a top view of an exemplary pixel of a light-emitting pixel area of an array in accordance with one or more embodiments.
Figure 4:
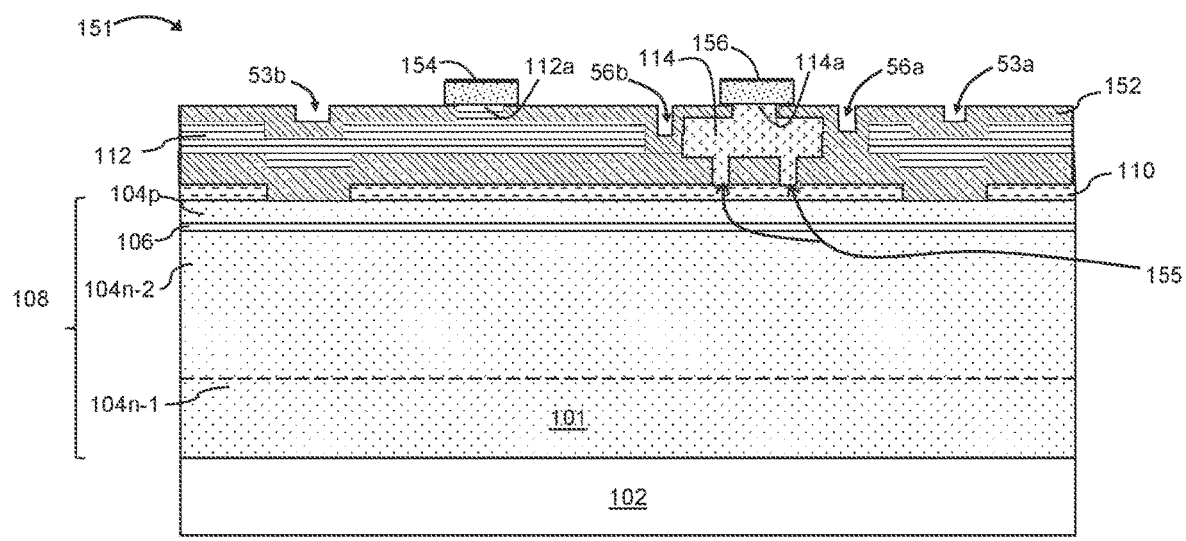
FIG. 4 is a cross-sectional view along line Z-Z of FIG. 3 in accordance with one or more embodiments.
Figure 5:
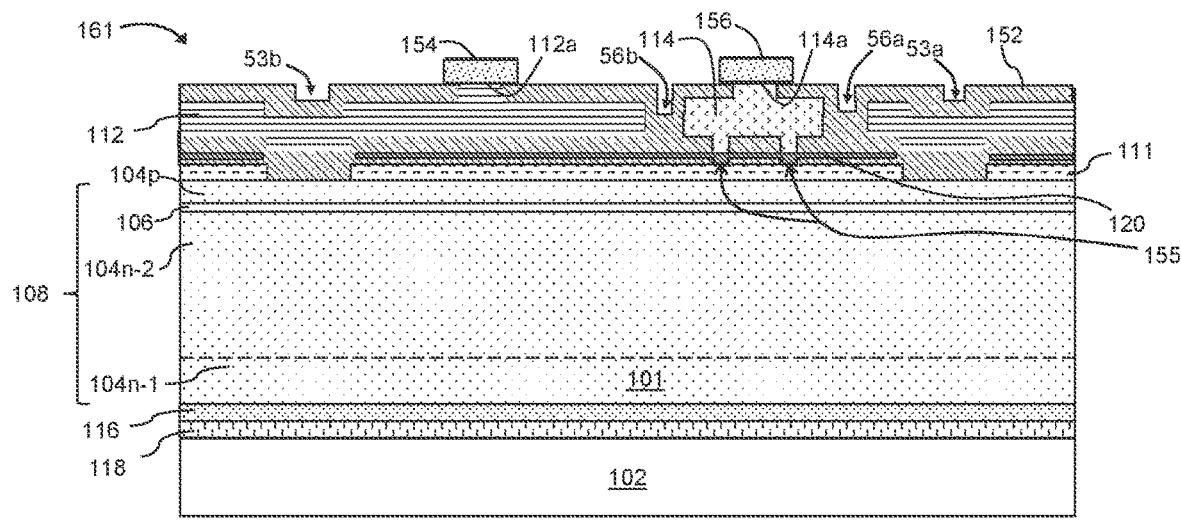
FIG. 5 is a cross-sectional view of an exemplary pixel of a light-emitting pixel area of an array in accordance with one or more embodiments.

FIG. 3 shows an illustration of a top view of an exemplary pixel 51 of a light-emitting pixel area of an array in accordance with one or more embodiments. As viewed from the top, N-contact material, cathode metallization bumps 54, and anode metallization bumps 56 of the pixel 51 can be seen. Dielectric material according to one or more embodiments is present but transparent. The array grid comprises sections 53a, 53b, 53c and 53d, which as shown by 53a and 53b, in FIGS. 4-5 is where there is no p-contact layer or anode current spreading layer. According to one or more embodiments, pixels are light emitting areas defined by array grid sections.

An anode grid comprises sections 56a, 56b, 56c, and 56d, which as shown by 56a and 56b, in FIGS. 4-5 is where there is separation of anodes and common cathode by dielectric material.

The exemplary pixel 51 is one that is adjacent to the common cathode.

Arrays herein comprise a plurality of pixels 51. Arrays herein comprise: a monolithic body, a light-emitting pixel area integral to the monolithic body, a plurality of anodes, and a common cathode.

FIG. 4 is a cross-sectional view of line Z-Z of FIG. 3 in accordance with one or more embodiments. FIG. 5 is a cross-sectional view of another pixel configuration. With reference to FIG. 4, pixel 151, and with reference to FIG. 5, pixel 161, each pixel 151, 161 comprises a device substrate 102 on which semiconductor layers 108 are positioned.

The semiconductor layers 108 comprise an N-type layer 104n, which has a first portion of the N-type layer 104n-1 and a second portion of the N-type layer 104n-2; an active layer 106; and a P-type layer 104p. None of the semiconductor layers 108 are segmented. The first portion of the N-type layer 104n-1 forms a monolithic body 101. A light-emitting pixel area (as depicted e.g., in FIGS. 1-2) is integral to the monolithic body 101 including semiconductor layers 108 comprising: the second portion of the N-type layer 104n-2, the active region 106, and the P-type layer 104p, the second portion of the N-type layer 104n-2 is integral to the first portion of the N-type layer 104n-1.

A P-contact layer 110 is segmented, and in contact with the P-type layer 104p. In arrays, there are a plurality of anodes, each anode comprising a segment of the P-contact layer 110 and one or more P-contact materials 114, each segmented P-contact layer 110 being in contact with the P-type layer 104p, which is not segmented.

Figure 6:
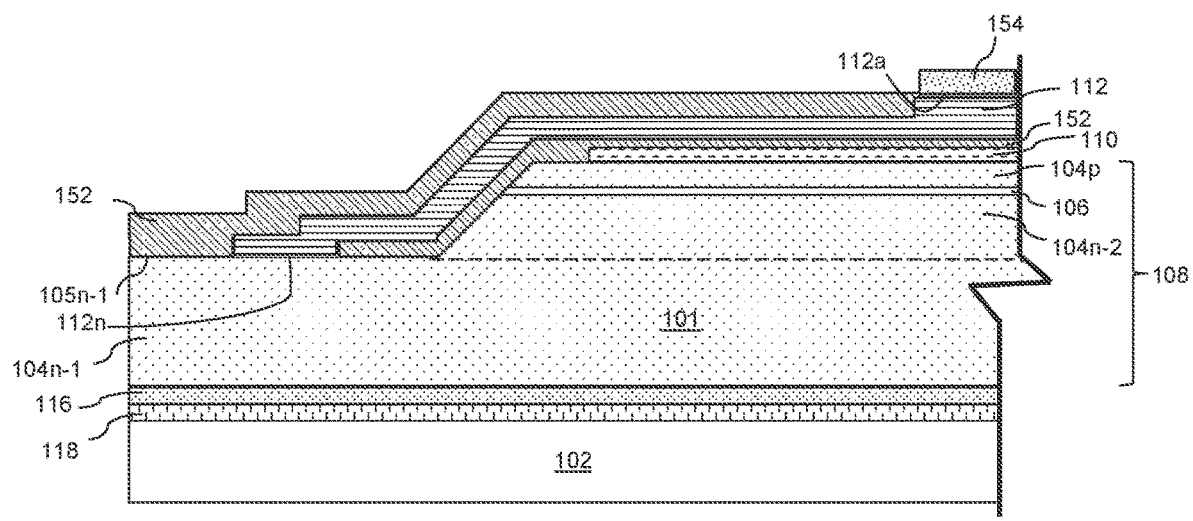
FIG. 6 is a portion of an exemplary a light emitting diode LED array showing a cross-section including a common cathode in accordance with some embodiments.

N-contact material 112 is shown between portions of the dielectric material, and is electrically isolated from the light-emitting pixel area comprising: the second portion of the N-type layer 104n-2, the active region 106, and the P-type layer 104p. The N-contact material 112 and its contact with the first portion of the N-type layer 104n-1 is illustrated in FIG. 6. The N-contact material 112 has an accessible portion of the N-contact material 112a to which an electrode metallization bump is attached, in particular, a cathode metallization bump 154.

The one or more P-contact materials 114 is in contact with the P-contact layer 110. The P-contact material 114 may comprise multiple layers and various configurations. In one or more embodiments, the P-contact material 114 partially resides in via openings 115, which are defined in part by portions of dielectric material 152, e.g., a via dielectric material. The P-contact material 114 may, in one or more embodiments, including one or more of a p-metal layer, a guard layer, a reflective material, a p-metal plug, and a bonding material. The P-contact material 114 has an accessible portion of the P-contact material 114a to which an electrode metallization bump is attached, in particular, an anode metallization bump 156.

The dielectric material 152 may be deposited in one or more separate operations, and may utilize one or more suitable materials. It is understood herein that one or more dielectric materials can provide the isolation needed, and the dielectric material is deposited and patterned in accordance with desired designs and applications. In some embodiments, the dielectric material comprises any suitable dielectric material, for example, silicon dioxide ($SiO_2$) or silicon oxynitride (SiON).

The one or more dielectric materials 152 of the arrays herein insulate: the second portion of the N-type layer, the active region, and the P-type layer from the common cathode; the anodes from each other; and the plurality of anodes from the common cathode.

As noted with respect to FIG. 3, the array grid sections 53a and 53b are locations where there is no p-contact layer or anode current spreading layer and no to minimal light emission at such locations. The anode grid sections 56a and 56b are locations where there is separation of anodes and common cathode by dielectric material and light emission at such locations is reduced or dim relative to other areas.

With further regard to FIG. 5, in a non-limiting embodiment, the P-contact layer 110 comprises an anode current spreading layer 111 and a reflective layer 120. The reflective layer 120 resides on a portion of the dielectric materials 152 and partially resides in via openings 155.

In one or more embodiments, the anode current spreading layer comprises indium tin oxide (ITO) or other suitable conducting, transparent materials, e.g., transparent conductive oxides (TCO), such as indium zinc oxide (IZO), and a thickness in a range of from 5 nm to 100 nm.

In one or more embodiments, the reflective layer 155 comprises a reflective metal, e.g., aluminum (Al), silver (Ag), or gold (Au).

In one or more embodiments, a body current spreading layer 116 contacts the first portion of the N-type layer 104n-1. In one or more embodiments, a body bonding layer 118 contact the body current spreading layer 116 on a surface opposite from the first portion of the N-type layer 104n-1. In one or more embodiments, the body current spreading layer comprises indium tin oxide (ITO) or other suitable conducting, transparent materials, e.g., transparent conductive oxides (TCO), such as indium zinc oxide (IZO), and a thickness in a range of from 5 nm to 100 nm.

FIG. 6 is a portion of an exemplary a light emitting diode LED array showing a cross-section including a common cathode in accordance with some embodiments. Consistent with FIGS. 4-5, the semiconductor layers 108 are positioned on the device substrate 102. The semiconductor layers 108 comprise the N-type layer 104n, which has the first portion of the N-type layer 104n-1 and the second portion of the N-type layer 104n-2; the active layer 106; and the P-type layer 104p. None of the semiconductor layers 108 are segmented. The first portion of the N-type layer 104n-1 forms the monolithic body 101. The common cathode is prepared from exposing an edge 105n-1 of the first portion of the N-type layer 104n-1. The common cathode comprises the N-contact material 112 in direct electrical contact with the first portion of the N-type layer 104n-1 at the N-contact area 112n.

The N-contact material 112 is shown between portions of the dielectric material, and is electrically isolated from the light-emitting pixel area comprising: the second portion of the N-type layer 104n-2, the active region 106, and the P-type layer 104p. The N-contact material 112 has an accessible portion of the N-contact material 112a to which an electrode metallization bump is attached, in particular, a cathode metallization bump 154.

The P-contact layer 110 is shown in contact with the P-type layer 104b and below a portion of the dielectric material 152.

In one or more embodiments, the body current spreading layer 116 contacts the first portion of the N-type layer 104n-1 on a surface opposite from the edge 105n-1 of the first portion of the N-type layer 104n-1. In one or more embodiments, a body bonding layer 118 contact the body current spreading layer 116 on a surface opposite from the first portion of the N-type layer 104n-1.

Figure 8:
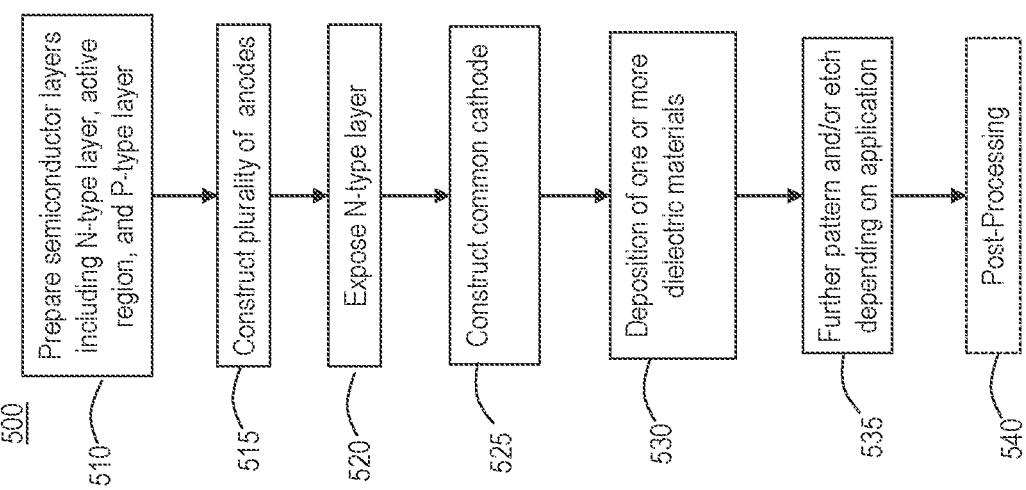
FIG. 8 provides a process flow diagram for manufacture of a light emitting diode (LED) array according to one or more embodiments.

FIG. 8 provides a process flow diagram 500 for manufacture of a light emitting diode (LED) array according to one or more embodiments. At operation 510, semiconductor layers including N-type layer, active region, and P-type layer are prepared according to methods known in the art. In one or more embodiments, the semiconductor layers are formed by epitaxial (EPI) growth. In one or more embodiments, the process starts with an LED EPI wafer, which wafer can be grown by any of the conventional growth techniques used in LED manufacturing or research and could be of different material systems including but not limited to GaN-based LEDs.

At operation 515, a plurality of anodes is constructed. Anodes include segmented P-contact layers, e.g., anode current spreading layers, and one or more P-contact materials and anode metallization bumps. In one or more embodiments, each anode comprises one or more via openings defined by via dielectric material.

At operation 520, a portion of the N-type layer is exposed. During fabrication, a common cathode will be in contact with a first portion of the N-type layer. The first portion of the N-type layer forms a monolithic body. The second portion of the n-type layer will be electrically isolated from the common cathode.

At operation 525, the common cathode is constructed by various deposition and patterning techniques as-needed for deposition of N-contact materials and insulating purposes. In one or more embodiments, the active region and the P-type layer are insulated from the common cathode, and the anode segments are insulated from the common cathode. One or more materials and layers may be used to provide the dielectric material. In one or more embodiments, the common cathode comprises one or more edge cathodes. Each edge cathode comprises one or more N-contact materials and one or more cathode metallization bumps.

Deposition of the electrode material for the common cathode and the anodes may be done simultaneously, subject to later patterning and dielectric deposition.

Electrode metallization bumps for both the anodes and the common cathode (e.g., one or more edge cathodes) can be applied to exposed portions of the P-contact material and the N-contact material, respectively. Depending on the pixel size, each anode could have one or multiple of these metal bumps. These segmented pads or bumps could be made of Ti/Au or any other metal with an ohmic contact to the P-type layer. Number of anode or cathode bumps and their shape can be chosen based on the pixel size, technical limitations or statistical distribution of defects on affected pixels.

Alternatively, the electrode material may be deposited in a single dose, and then further patterned as-needed to yield the anodes and the common cathode.

At operation 530, one or more dielectric materials are deposited as-needed for insulating and other purposes in conjunction with one or more other operations for various purposes, e.g., layering, insulating, and contacting. In one or more embodiments, the second portion of the N-type layer, the active region, and the P-type layer are insulated from the common cathode; the plurality of anodes are insulated from each other; and the plurality of anodes are insulated from the common cathode.

At operation 535, further patterning and etching is conducted as-needed in conjunction with one or more other operations for various purposes, e.g., layering, insulating, and contacting. In one or more embodiments, the P-contact layer is segmented by patterning and/or etching. In one or more embodiments, the anode current spreading layer is segmented by patterning and/or etching. In one or more embodiments, the reflective layer is segmented by patterning and/or etching.

At operation 540, optional further post-processing is performed. In one or more embodiments, further processing including formation of a passivation layer around a portion or the entirety of the array. In one or more embodiments, the processed structure retains the substrate, and is further processed. In one or more embodiments, the processed structure is flipped and affixed to a support, for example, a tape support, and the substrate is removed. Removal of the substrate is in accordance with methods known in the art including substrate laser liftoff. Techniques provided in FIGS. 7A-7E may be conducted as follows.

FIGS. 7A-7E show a schematic depiction to apply an array to a device substrate using a double flip technique in accordance with one or more embodiments, like structures have like numbering among FIGS. 7A to 7E. In FIG. 7A, an exemplary portion of a pixel area is provided: semiconductor layers 208 (including an N-type layer; an active layer; and a P-type layer) is prepared on a growth substrate 203. Thereafter, materials are deposited and patterned and/or etched as needed to create the array. In this embodiment, an anode current spreading layer 211 (segmented per anode) is shown on the semiconductor layers 208 (contacting the P-type layer), but any suitable p-contact material may be used. As shown, dielectric material 252 insulates the anodes, each comprising P-contact material 214 and the anode current spreading layer 211, from each other; and the plurality of anodes from the common cathode, which comprises N-contact material 212. A cathode metallization bump 254 contacts the N-contact material 212 and an anode metallization bump 256 contacts the P-contact material 214. Upon preparation of an array including the first structure according to FIG. 7A, a temporary bonding layer is applied to the surface of the first structure opposite the growth substrate, and the temporary bonding layer is attached to a temporary substrate.

FIG. 7B depicts a second structure after flipping the first structure for a first time, which had been processed to include the temporary bonding layer 207 and the temporary substrate 205.

FIG. 7C depicts a third structure after the growth substrate 203 was removed. Upon exposure of the N-type layer of the semiconductor layers 208, further layers of material are added according to one or more embodiments. The exposed N-type layer is optionally roughened and/or textured to help adhesion of further layers of material. In one or more embodiments, a body current spreading layer is deposited on the exposed N-type layer. In one or more embodiments, a body bonding layer is deposited on the body current spreading layer. A device substrate is thereafter adhered to the third structure.

FIG. 7D depicts a fourth structure after flipping the third structure, which had been processed to include the body current spreading layer 216, the body bonding layer 218, and the device substrate 202.

FIG. 7E depicts a fifth and final structure according to one or more embodiments, where the temporary bonding layer 207 and the temporary substrate 205 have been removed by methods known in the art (e.g., etching and/or laser lift-off), and the structure has been flipped a second time.

Further processing can include deposition of a down-converter material, e.g. layers of a phosphor material.

In some embodiments, LED arrays herein are further processed to include optical elements such as lenses, metalenses, and/or pre-collimators. Optical elements can also or alternatively include apertures, filters, a Fresnel lens, a convex lens, a concave lens, or any other suitable optical element that affects the projected light from the light emitting array. Additionally, one or more of the optical elements can have one or more coatings, including UV blocking or anti-reflective coatings. In some embodiments, optics can be used to correct or minimize two- or three-dimensional optical errors including pincushion distortion, barrel distortion, longitudinal chromatic aberration, spherical aberration, chromatic aberration, field curvature, astigmatism, or any other type of optical error. In some embodiments, optical elements can be used to magnify and/or correct images. Advantageously, in some embodiments magnification of display images allows the light emitting array to be physically smaller, of less weight, and require less power than larger displays. Additionally, magnification can increase a field of view of the displayed content allowing display presentation equals a user's normal field of view.

Display Devices

Some display devices comprise LED arrays, which include non-segmented pixels in a light-emitting pixel area integral to a monolithic body as disclosed herein.

Turning back to FIGS. 1-2 shows a top plan view of an LED monolithic arrays 10 and 40 comprising a plurality of pixels arranged in a grid of 7×7. In one or more embodiments, the array comprises an arrangement of 10×10 pixels, 20×20 pixels, 50×50 pixels, 100×100 pixels, and the like. Generally, the arrays are or n1×n2 mesas, where each of n1 and n2 is a number in a range of from 2 to 1000, and n1 and n2 can be equal or not equal.

In one or more embodiments, arrays of micro-LEDs (μLEDs or uLEDs) are used. Micro-LEDs can support high density pixels having a lateral dimension less than 100 μm by 100 μm. In some embodiments, micro-LEDs with dimensions of about 50 μm in diameter or width and smaller can be used. Such micro-LEDs can be used for the manufacture of color displays by aligning in close proximity micro-LEDs comprising red, blue and green wavelengths.

In some embodiments, the light emitting arrays include small numbers of micro-LEDs positioned on substrates that are centimeter scale area or greater. In some embodiments, the light emitting arrays include micro-LED pixels or pixel arrays with hundreds, thousands, or millions of light emitting LEDs positioned together on centimeter scale area substrates or smaller. In some embodiments, micro-LEDs can include light emitting diodes sized between 30 microns and 500 microns. The light emitting array(s) can be monochromatic, RGB, or other desired chromaticity. In some embodiments, pixels can be square, rectangular, hexagonal, or have curved perimeter. Pixels can be of the same size, of differing sizes, or similarly sized and grouped to present larger effective size.

In some embodiments, light emitting pixels and circuitry supporting light emitting arrays are packaged and optionally include a submount or printed circuit board connected for powering and controlling light production by semiconductor LEDs. In certain embodiments, a printed circuit board supporting light emitting array includes electrical vias, heat sinks, ground planes, electrical traces, and flip chip or other mounting systems. The submount or printed circuit board may be formed of any suitable material, such as ceramic, silicon, aluminum, etc. If the submount material is conductive, an insulating layer is formed over the substrate material, and the metal electrode pattern is formed over the insulating layer. The submount can act as a mechanical support, providing an electrical interface between electrodes on the light emitting array and a power supply, and also provide heat sink functionality.

In some embodiments, LED light emitting arrays include optical elements such as lenses, metalenses, and/or pre-collimators. Optical elements can also or alternatively include apertures, filters, a Fresnel lens, a convex lens, a concave lens, or any other suitable optical element that affects the projected light from the light emitting array. Additionally, one or more of the optical elements can have one or more coatings, including UV blocking or anti-reflective coatings. In some embodiments, optics can be used to correct or minimize two- or three dimensional optical errors including pincushion distortion, barrel distortion, longitudinal chromatic aberration, spherical aberration, chromatic aberration, field curvature, astigmatism, or any other type of optical error. In some embodiments, optical elements can be used to magnify and/or correct images. Advantageously, in some embodiments magnification of display images allows the light emitting array to be physically smaller, of less weight, and require less power than larger displays. Additionally, magnification can increase a field of view of the displayed content allowing display presentation equals a user's normal field of view.

Applications

Figure 9:
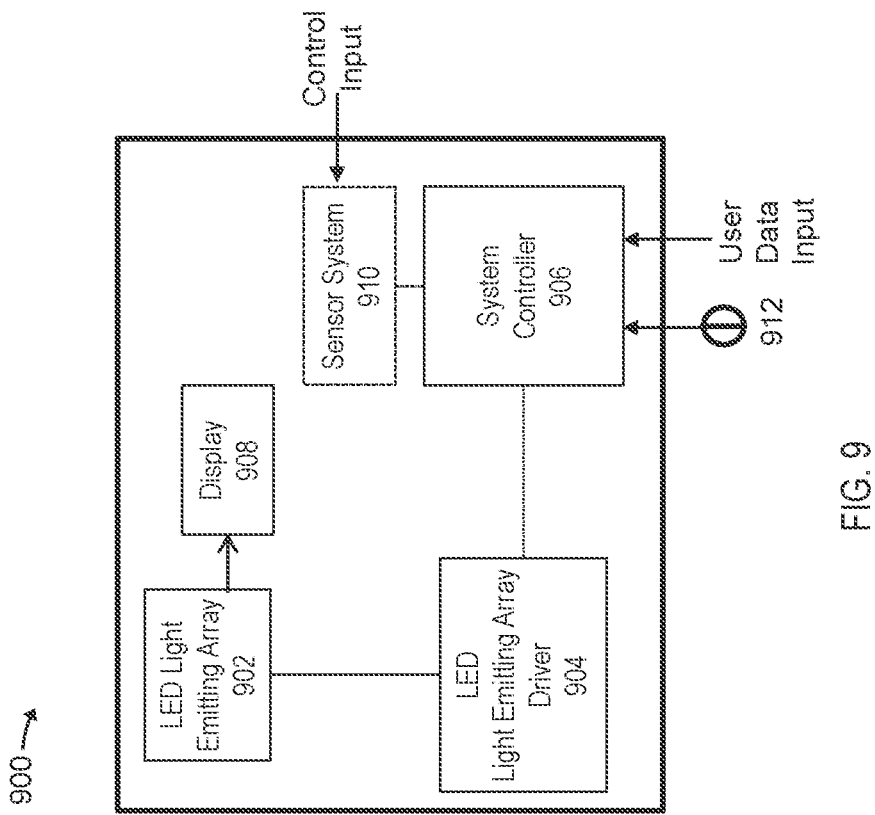
FIG. 9 schematically illustrates an exemplary display system comprising LED arrays according to embodiments herein.

FIG. 9 schematically illustrates an exemplary display system 900 utilizing LED arrays disclosed herein. The display system 900 comprises an LED light emitting array 902 and display 908 in electrical communication with an LED driver 904. The display system 900 also comprises a system controller 906, such as a microprocessor. The controller 906 is coupled to the LED driver 904. The controller 906 may also be coupled to the display 908 and to optional sensor(s) 910, and be powered by power source 912. In one or more embodiments, user data input is provided to system controller 906.

In one or more embodiments, the system is a projection system utilizing uLED arrays. In such an embodiment, the LED light emitting array 902 is an illumination array and lens system and the display 908 comprises a projector, wherein the illumination array and lens system of 902 and the projector of 908 may be controlled by the controller 906 to match their fields of view. In one or more embodiments, a plurality of light emitting diode (LED) arrays include a first plurality of arrays comprising a red color, a second plurality of arrays comprising a blue color, and a third plurality of arrays comprising a green color.

Optionally sensors 910 with control input may include, for example, positional sensors (e.g., a gyroscope and/or accelerometer) and/or other sensors that may be used to determine the position, speed, and orientation of system. The signals from the sensors 910 may be supplied to the controller 906 to be used to determine the appropriate course of action of the controller 906 (e.g., which LEDs are currently illuminating a target and which LEDs will be illuminating the target a predetermined amount of time later).

In operation, illumination from some or all of the pixels or anodes of the LED array in 902 may be adjusted—deactivated, operated at full intensity, or operated at an intermediate intensity. As noted above, beam focus or steering of light emitted by the LED array in 902 can be performed electronically by activating one or more subsets of the pixels or anodes, to permit dynamic adjustment of the beam shape without moving optics or changing the focus of the lens in the lighting apparatus.

Depending on the application, emitted light may be spectrally distinct, adaptive over time, and/or environmentally responsive. The light emitting arrays may provide preprogrammed light distribution in various intensity, spatial, or temporal patterns.

Other applications of LED devices herein include an augmented reality/virtual reality (AR/VR) systems, which may utilize uLEDs disclosed herein. One or more AR/VR systems include: augmented (AR) or virtual reality (VR) headsets, glasses, or projectors. Such AR/VR systems includes an LED light emitting array, an LED driver (or light emitting array controller), a system controller, an AR or VR display, a sensor system 810. Control input may be provided to the sensor system, while power and user data input is provided to the system controller. As will be understood, in some embodiments modules included in the AR/VR system can be compactly arranged in a single structure, or one or more elements can be separately mounted and connected via wireless or wired communication. For example, the light emitting array, AR or VR display, and sensor system can be mounted on a headset or glasses, with the LED driver and/or system controller separately mounted.

In one embodiment, the light emitting array can be used to project light in graphical or object patterns that can support AR/VR systems. In some embodiments, separate light emitting arrays can be used to provide display images, with AR features being provided by a distinct and separate micro-LED array. In some embodiments, a selected group of pixels can be used for displaying content to the user while tracking pixels can be used for providing tracking light used in eye tracking. Content display pixels are designed to emit visible light, with at least some portion of the visible band (approximately 400 nm to 750 nm). In contrast, tracking pixels can emit light in visible band or in the IR band (approximately 750 nm to 2,200 nm), or some combination thereof. As an alternative example, the tracking pixels could operate in the 800 to 1000 nanometer range. In some embodiments, the tracking pixels can emit tracking light during a time period that content pixels are turned off and are not displaying content to the user.

The AR/VR system can incorporate a wide range of optics in the LED light emitting array and/or AR/VR display, for example to couple light emitted by the LED light emitting array into AR/VR display as discussed above. For AR/VR applications, these optics may comprise nanofins and be designed to polarize the light they transmit.

In one embodiment, the light emitting array controller can be used to provide power and real time control for the light emitting array. For example, the light emitting array controller can be able to implement cell or group cell level or array control of amplitude and duty cycle. In some embodiments, the light emitting array controller further includes a frame buffer for holding generated or processed images that can be supplied to the light emitting array. Other supported modules can include digital control interfaces such as Inter-Integrated Circuit (I2C) serial bus, Serial Peripheral Interface (SPI), USB-C, HDMI, Display Port, or other suitable image or control modules that are configured to transmit needed image data, control data or instructions.

In operation, pixels in the images can be used to define response of corresponding light emitting array, with intensity and spatial modulation of LED pixels being based on the image(s). To reduce data rate issues, groups of pixels (e.g. 5×5 blocks) can be controlled as single blocks in some embodiments. In some embodiments, high speed and high data rate operation is supported, with pixel values from successive images able to be loaded as successive frames in an image sequence at a rate between 30 Hz and 100 Hz, with 60 Hz being typical. Pulse width modulation can be used to control each pixel to emit light in a pattern and with an intensity at least partially dependent on the image.

In some embodiments, the sensor system can include external sensors such as cameras, depth sensors, or audio sensors that monitor the environment, and internal sensors such as accelerometers or two or three axis gyroscopes that monitor AR/VR headset position. Other sensors can include but are not limited to air pressure, stress sensors, temperature sensors, or any other suitable sensors needed for local or remote environmental monitoring. In some embodiments, control input can include detected touch or taps, gestural input, or control based on headset or display position. As another example, based on the one or more measurement signals from one or more gyroscope or position sensors that measure translation or rotational movement, an estimated position of AR/VR system relative to an initial position can be determined.

In some embodiments, the system controller uses data from the sensor system to integrate measurement signals received from the accelerometers over time to estimate a velocity vector and integrate the velocity vector over time to determine an estimated position of a reference point for the AR/VR system. In other embodiments, the reference point used to describe the position of the AR/VR system can be based on depth sensor, camera positioning views, or optical field flow.

Based on changes in position, orientation, or movement of the AR/VR system, the system controller can send images or instructions the light emitting array controller. Changes or modification in the images or instructions can also be made by user data input, or automated data input as needed. User data input can include but is not limited to that provided by audio instructions, haptic feedback, eye or pupil positioning, or connected keyboard, mouse, or game controller.

Embodiments

Various embodiments are listed below. It will be understood that the embodiments listed below may be combined with all aspects and other embodiments in accordance with the scope of the invention.

Embodiment (a). A light emitting diode (LED) array comprising: a light-emitting pixel area integral to a monolithic body, the light-emitting pixel area including semiconductor layers comprising: a second portion of an N-type layer, an active region, and a P-type layer; the monolithic body comprising a first portion of an N-type layer, the second portion of the N-type layer being integral to the first portion of the N-type layer; a plurality of anodes, each anode comprising a P-contact layer and one or more P-contact materials, each P-contact layer being in contact with the P-type layer; a common cathode comprising one or more N-contact materials in contact with the first portion of the N-type layer; one or more dielectric materials insulating: the second portion of the N-type layer, the active region, and the P-type layer from the common cathode; the plurality of anodes from each other; and the plurality of anodes from the common cathode.

Embodiment (b). The light emitting diode (LED) array of embodiment (a), wherein the P-contact layer of each of the anodes comprises an anode current spreading layer and a reflective layer.

Embodiment (c). The light emitting diode (LED) array of any of embodiments (a) to (b), wherein each of the anodes comprises one or more via openings defined by via dielectric material.

Embodiment (d). The light emitting diode (LED) array of any of embodiments (a) to (c) further comprising cathode metallization bumps on accessible portions of the N-contact materials, and anode metallization bumps on accessible portions of the P-contact materials, wherein the cathode metallization bumps and the anode metallization bumps are on the same side of the semiconductor layers.

Embodiment (e). The light emitting diode (LED) array of any of embodiments (a) to (d) further comprising a body current spreading layer contacting the first portion of the N-type layer on a surface opposite from the common cathode.

Embodiment (f). The light emitting diode (LED) array of embodiment (e) further comprising a device substrate and a body bonding layer contacting the device substrate and the body current spreading layer on a surface opposite from the first portion of the N-type layer.

Embodiment (g). The light emitting diode (LED) array of any of embodiments (a) to (f), wherein the common cathode comprises a first edge cathode along a first side of the light-emitting pixel area and a second edge cathode along a second side of the light-emitting pixel area opposite the first side of the light-emitting pixel area.

Embodiment (h). The light emitting diode (LED) array of embodiment (g), wherein the common cathode further comprises a third edge cathode along a third side of the light-emitting pixel area and a fourth edge cathode along a fourth side of the light-emitting pixel area opposite the third side of the light-emitting pixel area.

Embodiment (i). The light emitting diode (LED) array of any of embodiments (a) to (h), wherein in use the light-emitting pixel area is effective to minimize appearance of pixilation.

Embodiment (j). The light emitting diode (LED) array of any of embodiments (a) to (i), wherein the anodes are individually addressable.

Embodiment (k). The light emitting diode (LED) array of any of embodiments (a) to (j), in use the semiconductor layers are effective to deliver a single color.

Embodiment (1). A display comprising: a plurality of light emitting diode (LED) arrays according to any of embodiments (a) to (k) affixed to a device substrate, wherein a first plurality of arrays comprises a red color, a second plurality of arrays comprises a blue color, and a third plurality of arrays comprises a green color.

Embodiment (m). A method of making a light emitting diode (LED) array comprising: preparing a plurality of semiconductor layers including an N-type layer, an active region, and a P-type layer on a growth substrate; constructing a plurality of anodes in contact with the P-type layer, each anode comprising a P-contact layer and one or more P-contact materials, each P-contact layer being in contact with the P-type layer; exposing a first portion of the N-type layer, thereby creating a light-emitting pixel area comprising: a second portion of the N-type layer, the active region, and the P-type layer, the second portion of the N-type layer being integral to the first portion of the N-type layer; constructing a common cathode in contact with the first portion of the N-type layer; and depositing one or more dielectric materials insulating: the second portion of the N-type layer, the active region, and the P-type layer from the common cathode, the anodes from each other, and the plurality of anodes from the common cathode.

Embodiment (n). The method of embodiment (m), wherein the P-contact layer comprises an anode current spreading layer and a reflective layer, and the constructing of the plurality of anodes comprises: depositing the anode current spreading layer on the P-type layer; segmenting the anode current spreading layer to form anode current spreading layer segments; depositing a first dielectric material to isolate the anode current spreading layer segments; etching one or more via openings into the first dielectric material, depositing the layer into the via openings and onto the first dielectric material, and depositing the one or more P-contact materials onto the reflective layer.

Embodiment (o). The method of any of embodiments (m) to (n), wherein the constructing of the common cathode on the first portion of the N-type layer comprises: depositing one or more N-contact materials in direct electrical contact with the first portion of the N-type layer.

Embodiment (p). The method of embodiment (o) further comprising further comprising depositing cathode metallization bumps on accessible portions of the one or more N-contact materials, and depositing anode metallization bumps on each accessible portion of the P-contact materials, wherein the cathode metallization bumps and the anode metallization bumps are on the same side of the semiconductor layers.

Embodiment (q). The method of any of embodiments (m) to (p), further comprising: depositing a temporary bonding layer to a surface of the device opposite the growth substrate, attaching the temporary bonding layer to a temporary substrate, removing the growth substrate to expose a surface of the first portion of the N-type layer opposite from the common cathode, optionally texturing the surface of the first portion of the N-type layer opposite from the common cathode, and affixing the surface of the first portion of the N-type layer opposite from the common cathode to a device substrate.

Embodiment (r). The method of embodiment (q), further comprising before affixing the surface of the first portion of the N-type layer opposite from the common cathode to the device substrate, depositing a body current spreading layer on the surface of the first portion of the N-type layer opposite from the common cathode, and further depositing a body bonding layer contacting the body current spreading layer on a surface opposite from the first portion of the N-type layer.

Embodiment (s). The method of any of embodiments (m) to (r) further comprising locating the common cathode as a first edge cathode along a first side of the light-emitting pixel area and a second edge cathode along a second side of the light-emitting pixel area opposite the first side of the light-emitting pixel area, and optionally further locating the common cathode as a third edge cathode along a third side of the light-emitting pixel area and a fourth edge cathode along a fourth side of the light-emitting pixel area opposite the third side of the light-emitting pixel area.

Embodiment (t). A method of projecting light onto a projection surface, the method comprising: activating a display according to embodiment (1) to generate light; and projecting the light onto the projection surface.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

What is claimed is:

1. A light emitting diode (LED) array comprising:
    a light-emitting pixel area integral to a monolithic body, the light-emitting pixel area including semiconductor layers comprising: a second portion of an N-type layer, an active region, and a P-type layer;
    the monolithic body comprising a first portion of an N-type layer, the second portion of the N-type layer being integral to the first portion of the N-type layer;
    a plurality of anodes, each anode comprising a P-contact layer and one or more P-contact materials, each P-contact layer being in contact with the P-type layer;
    a common cathode comprising one or more N-contact materials in contact with the first portion of the N-type layer;
    one or more dielectric materials insulating: the second portion of the N-type layer, the active region, and the P-type layer from the common cathode; the plurality of anodes from each other; and the plurality of anodes from the common cathode.

2. The light emitting diode (LED) array of claim 1, wherein the P-contact layer of each of the anodes comprises an anode current spreading layer and a reflective layer.

3. The light emitting diode (LED) array of claim 1, wherein each of the anodes comprises one or more via openings defined by via dielectric material.

4. The light emitting diode (LED) array of claim 1 further comprising cathode metallization bumps on accessible portions of the N-contact materials, and anode metallization bumps on accessible portions of the P-contact materials, wherein the cathode metallization bumps and the anode metallization bumps are on the same side of the semiconductor layers.

5. The light emitting diode (LED) array of claim 1 further comprising a body current spreading layer contacting the first portion of the N-type layer on a surface opposite from the common cathode.

6. The light emitting diode (LED) array of claim 5 further comprising a device substrate and a body bonding layer contacting the device substrate and the body current spreading layer on a surface opposite from the first portion of the N-type layer.

7. The light emitting diode (LED) array of claim 1, wherein the common cathode comprises a first edge cathode along a first side of the light-emitting pixel area and a second edge cathode along a second side of the light-emitting pixel area opposite the first side of the light-emitting pixel area.

8. The light emitting diode (LED) array of claim 7, wherein the common cathode further comprises a third edge cathode along a third side of the light-emitting pixel area and a fourth edge cathode along a fourth side of the light-emitting pixel area opposite the third side of the light-emitting pixel area.

9. The light emitting diode (LED) array of claim 1, wherein in use the light-emitting pixel area is effective to minimize appearance of pixilation.

10. The light emitting diode (LED) array of claim 1, wherein the anodes are individually addressable.

11. The light emitting diode (LED) array of claim 1, wherein in use the semiconductor layers are effective to deliver a single color.

12. A display comprising: a plurality of light emitting diode (LED) arrays according to claim 1 affixed to a device substrate, wherein a first plurality of arrays comprises a red color, a second plurality of arrays comprises a blue color, and a third plurality of arrays comprises a green color.

* * * * *